United States

Leskovar

4,158,810

Jun. 19, 1979

[54] TELEMETERING POST FOR MEASURING VARIABLES IN A HIGH-VOLTAGE OVERHEAD LINE

[76] Inventor: Silvin M. Leskovar, Trzaska 51, Ljubljana, Yugoslavia, 61000

[21] Appl. No.: 784,597

[22] Filed: Apr. 4, 1977

Related U.S. Application Data

[63] Continuation-in-part of Ser. No. 624,782, Oct. 20, 1975, abandoned.

[30] Foreign Application Priority Data

Oct. 21, 1974 [YU] Yugoslavia ............................ 2811/74

[51] Int. Cl.² .................. G01R 1/20; G08C 15/06
[52] U.S. Cl. ................................. 324/127; 340/183; 343/204
[58] Field of Search ............. 324/127, 133; 73/170 R; 340/183, 206; 325/39; 343/204

[56] References Cited

U.S. PATENT DOCUMENTS

| | | | |
|---|---|---|---|
| 2,287,786 | 6/1942 | Diamond et al. | 73/170 R |
| 2,724,821 | 11/1955 | Schweitzer, Jr. | 324/127 |
| 3,488,591 | 1/1970 | Sonnenberg et al. | 324/127 |

*Primary Examiner*—Rudolph V. Rolinec
*Assistant Examiner*—Ernest F. Karlsen
*Attorney, Agent, or Firm*—Fleit & Jacobson

[57] ABSTRACT

One or more sensors coating a conductor of a high-voltage overhead line provide the signals for measuring variables associated with the operation of a high-voltage overhead line such as voltage, current or phase, wire temperature, ambient ionization etc. These signals are converted by analog-to-digital conversion in data which are acquired to form messages about operating status of a high-voltage overhead line, which are sent out as digital telegrams wirelessly to a remote point. The entire acquisition process and data transmission are accomplished by the post positioned on a conductor of the high-voltage overhead line, operating on the potential of that conductor and receiving the operating energy from same line.

7 Claims, 5 Drawing Figures

4,158,810

TELEMETERING POST FOR MEASURING VARIABLES IN A HIGH-VOLTAGE OVERHEAD LINE

CROSS-REFERENCE TO RELATED APPLICATION

This is a continuation-in-part of my copending application Ser. No. 624,782 filed Oct. 20, 1975 and now abandoned.

FIELD OF THE INVENTION

This invention relates generally to a post for real time acquisition and communication of data representing the quantities associated with the operation of a high-voltage overhead line. The communication part is intended for wireless transfer of data to a remote point, while the post is operated on the potential of the high-voltage overhead line and is energetically supplied by appropriate power supply being a part of that post.

The quantities associated with the operation of a high-voltage overhead line calling for a digital representation and corresponding acquisition on that same line might, among others, be the quantities related to voltage on a conductor, the quantities related to current flow in a conductor, quantities related to both voltage and current at the same time, conductor temperature, ambient ionization, ambient temperature, wind velocity as well as some other quantities, which all together build a complex operational status of the high-voltage overhead line.

More particularly this invention relates to means for real time data acquisition in combination with digital processing, as e.g. microprocessor circuitry, comprising appropriate storage all in combination with suitable control circuitry for producing a data telegram transferred wirelessly to a remote point. The telegram contains the message of a complex operational status of a high-voltage overhead line and comprises among other the data derived from data calculations and/or data combinations performed with processor. The entire device including data acquisition, data processing, data transmission and power supply constitutes a novel real time acquisition and communication post for high-voltage overhead lines.

Advantageously data transferring means may be built up by transceivers enabling selective data transfer, control and verification from the mentioned post to a remote point and vice versa.

BACKGROUND OF THE INVENTION

Conventional equipment for measuring quantities associated with the operation of a high-voltage overhead line usually utilizes, for variables to be measured, separate means for transforming the measured quantity, as for instance current or voltage, into corresponding analog quantity at the ground potential indicating the measured quantity. Voltage measurements are usually accomplished by the use of high-voltage dividers, and current measurements usually by step-down transformers. The measurement of current flow in a high-voltage conductor, as known from the U.S. Pat. No. 2,724,821, can also be accomplished by high-frequency transmitter, modulated by current in that conductor. This kind of current measurement employs less bulky and expensive equipment than are step-down current transformers, but still preserves their functional characteristics with respect to signal form at the ground potential.

As known from the U.S. Pat. No. 3,488,591, there also exists means for obtaining analog signals at the ground potential corresponding to current and voltage but only in connection with a bushing supporting a high-voltage line as such measuring means requires to measure quantity proportional to field. Such means cannot be used for measuring voltages and currents in an arbitrary point on the high-voltage overhead line.

The use of keying in discrete aural pulses, where the keying frequency is in discrete relationship with the measured values, is described in the U.S. Pat. No. 2,287,786. This kind of solution of the problem does not represent measured quantities as digital data neither are the measured quantities transferred as digital data.

The number of variables in conventional measuring equipment is usually limited to current and voltage and it usually relates to their RMS values regardless of the fact that it is highly desirable to obtain also some other values related with a variable.

As an example for the current flow in an AC high-voltage overhead line, it is desirable to obtain accurate data not only about its RMS value or its peak value, but also the indication of time the current crosses the zero point, the data about composition of the higher harmonics, data related to transients, and other data, if needed.

In summary, the conventional equipment does not allow the complex measurement of quantities associated with the operation of a high-voltage overhead line on that same line and on its potential, it neither allows a real time acquisition of data with the aim to present the operational status of the high-voltage overhead line like a data telegram transmissible wirelessly to a remote point.

OBJECTS OF THE INVENTION

A general object of my present invention is therefore to provide equipment operable on the high-voltage overhead line for real time acquisition of data which represents quantities being under transmission as well as quantities associated with operational conditions of a high-voltage overhead line.

A further object is to provide better accuracy of measurements, which can only be obtained by using appropriate digital techniques.

As well known, A/D conversion technique cuts measuring cost, reduces the complexity of the technical embodiment, and allows measurement accuracies within ±0.001%, and even in field measurements an accuracy better than ±0.01% can be obtained. Digital measuring of quantities of a high-voltage overhead line directly on itself enables not only high precision of measurements, but also the acquisition of measuring data in real time prior to their transmission to a remote point. So an object of this invention is also to provide means for data acquisition of the high-voltage overhead line prior to their transmission to a remote point.

Another object of the device is to form different messages for different operating conditions of the high-voltage overhead line as, e.g., special messages for transients, overloads which differ from messages for normal operating conditions.

Other objects of the invention will in part be obvious and in part appear hereinafter.

SUMMARY OF THE INVENTION

In accordance with my present invention the telemetering post for a high-voltage overhead line, positioned on a conductor of that line and operating on the potential of that conductor comprises a real time acquisition unit consisting of sampling and conversion means, digital output and control circuitry, one or more sensors juxtaposed with the mentioned conductor for monitoring respective variables of the electric and/or the nonelectric type as discussed above, a data transmitter, power supply and circuits for feeding operating energy.

According to a more specific feature of my invention, the acquisition unit comprises at least an analog-to-digital converter optionally equipped with sample-hold circuitry, connected to a multiplexer which receives signals from the sensing means.

Among its input signals the multiplexer selects one signal in one increment of time in the order determined by control circuitry, whereby the multiplexer as well as the analog-to-digital converter is simultaneously controlled by said control circuitry. The analog-to-digital converter then converts said signal into a digital value placed by the end of conversion in a register within that analog-to-digital converter, whereby this register acts as buffer register inside the acquisition unit.

So, it is well possible to sample different quantities, applied to multiplexer inputs, with different sampling density, as for instance with a high density of the current flow and with a low density, the quantity corresponding to temperature. Advantageously, the acquisition unit is adapted to utilize different sensing means, some of them providing analog signals and some of them numerical readouts or digital values, respectively. That acquisition unit comprises analog multiplexer, channel multiplexer, analog-to-digital converter means, buffer register and control circuitry, in combination, whereby the control circuitry simultaneously controls the means requiring control for their operation. The buffer register is associated with the output of the channel multiplexer, the channels of that multiplexer being simultaneously connected to the register included in the analog-to-digital converter and/or to digital sensing devices providing digital values. The analog-to-digital converter is connected to analog multiplexer, while analog sensing means are connected to analog multiplexer inputs. The channel multiplexer handles the transfer of data from their origin to buffer register.

The buffer-to-output circuitry comprises digital means for parallel to serial conversion of data being in said buffer register or, in a more particular case, said circuitry comprises digital means for temporary storage, processing, manipulating and coding of data resulting in a data telegram corresponding to a complex status of the high-voltage overhead line. Afterwards, the channel for serial output provides the serial output of the telegram.

The data transmitting means comprise high-frequency signal generating means, discrete signal modulating means, and high-frequency radiation means. The modulation means, which are connected to the output of the acquisition unit, accomplish the modulation of the high-frequency signal with digital values being transmitted by said data transmission means.

The control circuitry comprises a clock generator, one or more counters, storage devices, and logic circuitry. The clock generator, counter or counters, storage devices, and the logic circuitry are composed in such manner that this composition enables the generation of predetermined signals required for once defined operations of the acquisition unit.

BRIEF DESCRIPTION OF THE DRAWING

The above and other features of my invention will now be described in detail with reference to the accompanying drawing in which.

SPECIFIC DESCRIPTION

Figure 1:
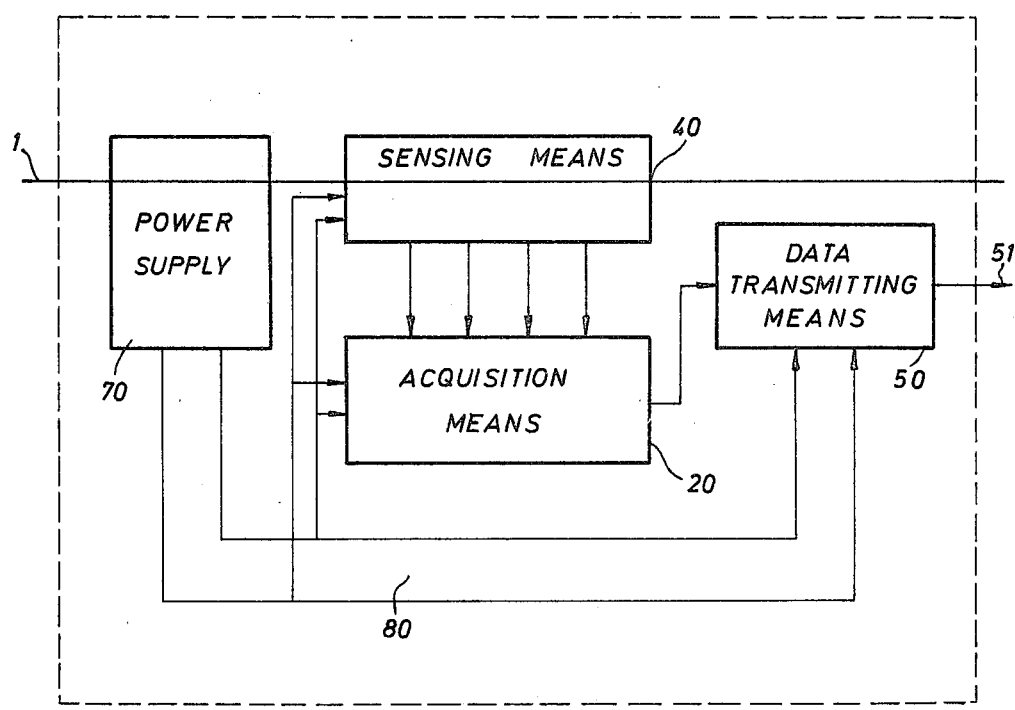
FIG. 1 is a block diagram of a telemetering post constituting my invention.

FIG. 1 presents the basic layout of a telemetering post for a high-voltage overhead line, which is positioned on the high-voltage overhead line conductor 1 and operates on that potential. The telemetering post comprises sensing means 40 juxtaposed with the conductor 1 for monitoring at least one variable associated with the operation of the high-voltage overhead line. Sensing means 40 deliver signals to be measured to acquisition means 20 which perform the measurements and prepare the message about the operational status of the high-voltage overhead line. These messages can be of different types depending upon the operating conditions of the high-voltage overhead line, such as normal operation, transients, overloads etc.

The messages are encoded in serial digital signals and fed to data transmitting means 50 which uses the digital signals for modulation. The signal output 51 contains the modulated high-frequency signal. The preferred kind of modulation is phase or frequency modulation, but also other kinds of modulation are possible. The high-frequency signal is received by the appropriate receiver located at a remote point where the demodulation of the received signal is accomplished and the transmitted message is restored.

The supply of energy for the post is provided by power supply 70 which in turn is energized by the high-voltage overhead line conductor 1 as well as by the voltage sensor. Acquisition means 20, data transmitting means 50 and those sensing means which require the supply of energy are connected with the power supply through the feeding circuitry 80.

Figure 2:
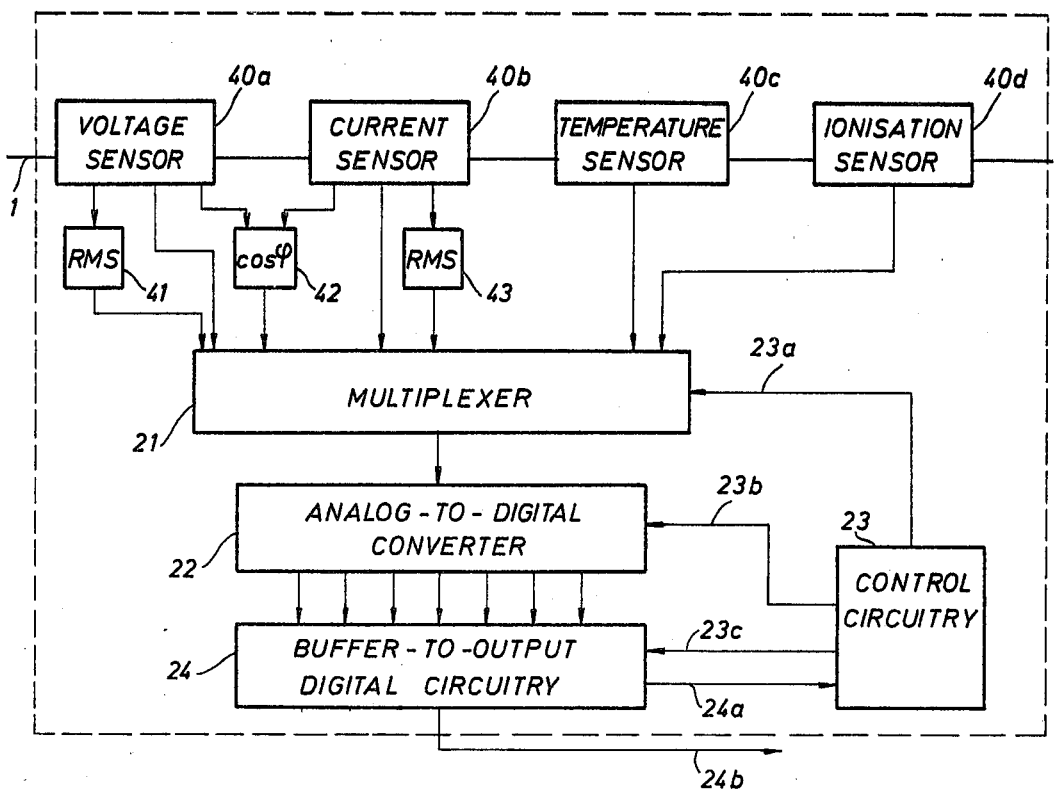
FIG. 2 is a more detailed diagram of circuits for data acquisition in the system of FIG. 1.

A more detailed understanding of the invention can be obtained by observing FIG. 2. This Figure illustrates voltage sensor 40a, current sensor 40b, temperature sensor 40c, and ionization sensor 40d.

Elements for transformed quantities are attached to these sensors, such as e.g.: element 41 for obtaining RMS value of voltage, element 42 for obtaining the signal corresponding to the power factor cos $\phi$ between voltage and current, and element 43 for obtaining RMS value of current.

The signals from the sensors and added elements are fed to multiplexer 21 which delivers same to analog-to-digital converter 22 in increments of time. The lengths of these increments as well as their relationship with the input signals are determined by control circuitry 23 through interconnection 23a. In this way it is possible to select among signals which are fed to analog-to-digital converter 22 according to the operational conditions. For example, during the transient only the voltage signal is selected for observation. Analog-to-digital converter 22, optionally equipped with a sample-hold circuitry, samples the signals and converts same into digital values placed by the end of conversion in a register within that analog-to-digital converter, whereby this register acts as buffer register inside the acquisition means. The entire process is controlled by the control circuitry through interconnection 23b.

Figure 4:
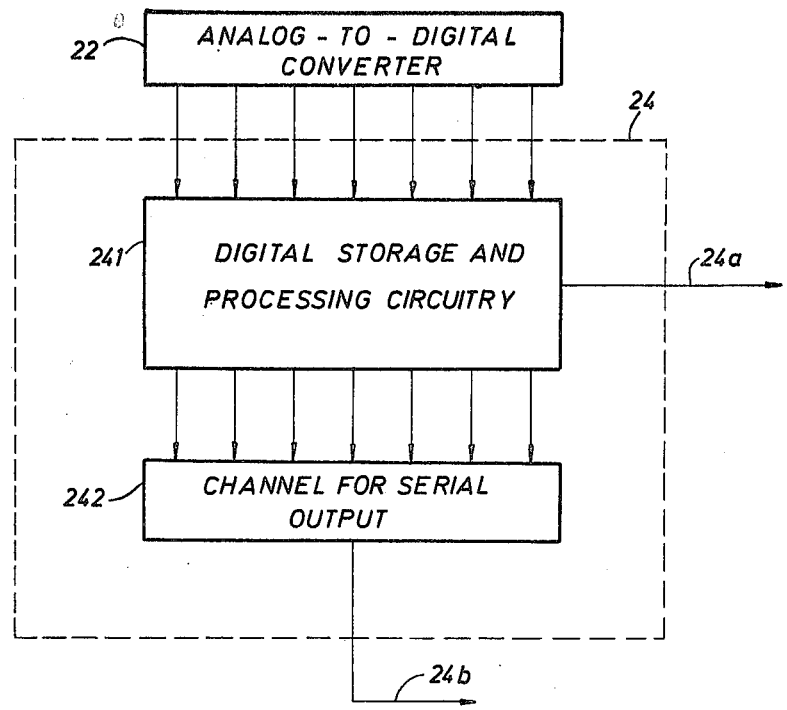
FIG. 4 is a more detailed diagram of buffer-to-output digital circuitry being a part of data-acquisition circuits in FIG. 2.

The digital values obtained by the analog-to-digital conversion are fed to buffer-to-output digital circuitry 24. In the simplest case the buffer-to-output circuitry only performs parallel to serial conversion and encoding of data. In a more particular case, as shown in FIG. 4, the buffer-to-output circuitry 24 comprises digital storage and processing circuitry 241 which serves for temporary storage, processing, manipulating and coding of data, as needed for forming the message on the status of the high-voltage transmission line. The message is formed as a digital telegram which is delivered through channel-for-serial output 242 to data transmitting means 50 over interconnection 24b.

Control circuitry 23 provides also control signals for the entire buffer-to-output digital circuitry, which is accomplished over interconnection 23c. The control of the entire process up to the formation of the data telegram depends upon the kind of the message contained in the telegram, which in turn depends upon the operational conditions of the high-voltage overhead line. One of the functions of the digital storage and processing circuitry 241 of FIG. 4 is to provide instructions for control circuitry 23 by means of interconnection 24a. These instructions are based upon the data accumulated in the digital storage.

Figure 3:
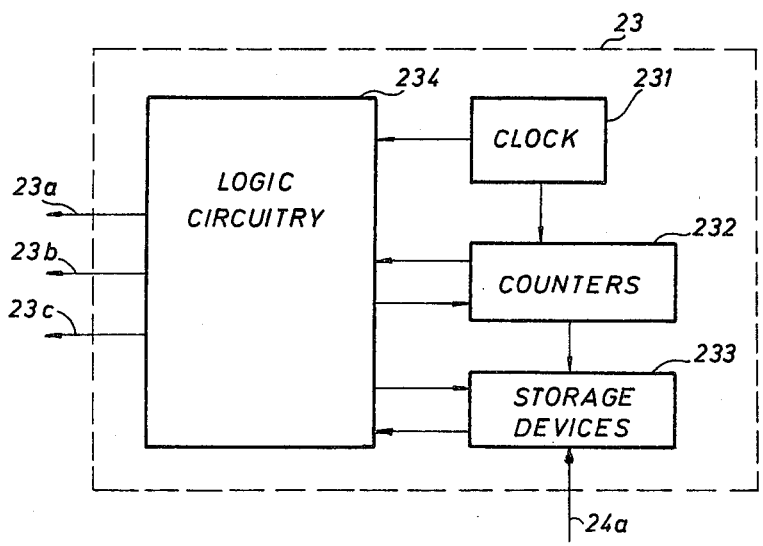
FIG. 3 shows details of data-acquisition control circuitry of FIG. 2.

FIG. 3 shows control circuitry 23 controlling the operation of all units 21, 22, 24 of FIG. 2, as comprosing clock 231, one or more counters 232, storage devices 233 and logic circuitry 234. Depending upon the operating conditions of the high-voltage overhead line, the instruction coming over 24a and stored in storage devices 233 is used in the formation of all control signals for building a telegram, including its identification part. Since it is possible to form arbitrary pulse patterns by means of a clock, counters and logic circuitry, the design of control circuitry 23 does not present any technical difficulty. The entire acquisition system, including the control circuitry, could also be built by using microprocessor devices available on the market.

Figure 5:
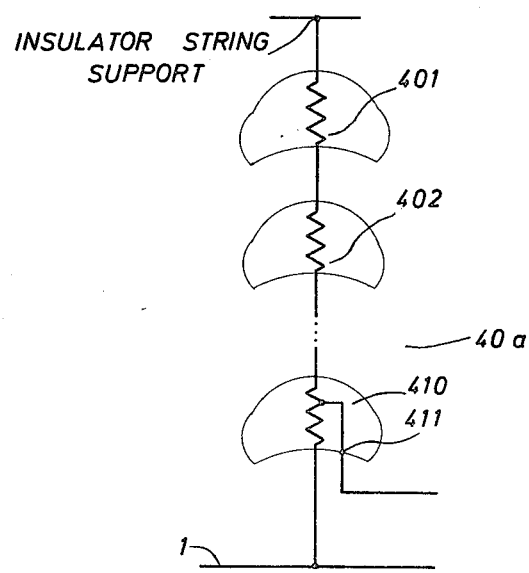
FIG. 5 illustrates the voltage sensor.

FIG. 5 shows the design of voltage sensor 40a. Inside the insulators of the insulator chain which carries high-voltage conductor 1 are located resistances 401, 402 etc. These resistances form the path for the voltage division. The last insulator, which is attached to high-voltage conductor 1, contains voltage divider 410. The tapped voltage is available at special terminal 411 at base of insulator. Terminal 411 represents the output of voltage sensor 40a in FIG. 2. Instead of the resistive voltage divider it is possible to use the capacitive voltage divider in which resistances 401, 402 etc. are replaced by suitable capacitances.

I claim:

1. A telemetering post for a high-voltage overhead line, positioned on the power line conductor and supplied with the energy from same line, comprising:
   sensing means juxtaposed with said conductor for monitoring at least one variable associated therewith and for producing output signals therefrom;
   acquisition means connected to receive said output signals from said sensing means for measuring and real time data acquisition and for producing acquired data output signals;
   transmitting means connected to receive said acquired data output signals for sending out acquired data;
   circuit means for feeding operating energy from said power line conductor to said sensing means, said acquisition means, and said transmitting means; and
   said acquisition means including
   (a) at least one analog-to-digital converter of the type having an internal buffer register and sample-hold circuitry,
   (b) multiplexer means, connected on the input side to said output signals from said sensing means and on the output side to said analog-to-digital converter;
   (c) control circuitry for controlling said multiplexer means and said analog-to-digital converter, and
   (d) buffer-to-output digital circuitry connected to said analog-to-digital converter;
   whereby said multiplexer means is controlled to select from the input signals thereto one signal in one increment of time in the order determined by said control circuitry and said analog-to-digital converter is controlled to convert said selected signal into a digital value which is entered in said register of said analog-to-digital converter and is fed to said buffer-to-output circuitry and thence to said transmitting means.

2. A telemetering post as defined in claim 1 wherein said acquisition means is adapted to utilize plural sensing means, some of which provide analog signals and some of which provide digital signals, respectively, said multiplexer comprising an analog multiplexer and a channel multiplexer, said control circuitry controlling simultaneously said multiplexer means and said analog-to-digital converter, an additional buffer register connected to the output of said channel multiplexer, the input channels of said channel multiplexer being simultaneously connected to said internal buffer register of said analog-to-digital converter and to said plural sensing means which provide digital signals, said analog-to-digital converter being connected to the output of said analog multiplexer, said plural sensing means which provide analog signals being connected to said analog multiplexer inputs, and said channel multiplexer performing transfer of data.

3. A telemetering post as defined in claim 1 wherein said buffer-to-output digital circuitry in said acquisition means comprises digital means for parallel to serial conversion of data being in said buffer register.

4. A telemetering post as defined in claim 1 wherein said acquisition means the data from said buffer register is delivered to said buffer-to-output digital circuitry performing storage, processing, structuring and coding of data as needed for forming the message about operational status of the high-voltage overhead line in form of a digital data message including an identification part, said means in addition accomplishing the serial output of said data message.

5. A telemetering post as defined in claim 1 wherein said control circuitry in said acquisition means comprises a clock generator, one or more counters, storage devices and logic circuitry, said clock generator, said counter or counters, said logic circuitry in combination with said storage devices generating appropriate control signals for once defined operations of said acquisition means.

6. A telemetering post as defined in claim 1 wherein said transmitting means comprises, in combination, high-frequency signal generating means, discrete signal modulation means and high-frequency radiation means, said modulation means being connected to the output of said acquisition means and accomplishing the modulation of said high-frequency signal, said modulation being a representation of digital values being transmitted by said data transmission means.

7. A telemetering post as defined in claim 1 wherein the voltage sensing of said sensing means is performed by means of a voltage divider located within insulators carrying the high-voltage conductor.

* * * * *